United States Patent
Wang et al.

(10) Patent No.: US 11,171,062 B2
(45) Date of Patent: Nov. 9, 2021

(54) SEMICONDUCTOR STRUCTURE AND METHOD FOR THE FORMING SAME

(71) Applicants: Semiconductor Manufacturing International (Beijing) Corporation, Beijing (CN); Semiconductor Manufacturing International (Shanghai) Corporation, Shanghai (CN)

(72) Inventors: Nan Wang, Shanghai (CN); Zhan Ying, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 237 days.

(21) Appl. No.: 16/601,864

(22) Filed: Oct. 15, 2019

(65) Prior Publication Data

US 2020/0235016 A1 Jul. 23, 2020

(30) Foreign Application Priority Data

Jan. 18, 2019 (CN) .......................... 201910047290.8

(51) Int. Cl.
*H01L 29/78* (2006.01)
*H01L 21/8238* (2006.01)
(Continued)

(52) U.S. Cl.
CPC ................ *H01L 21/823878* (2013.01); *H01L 21/823814* (2013.01); *H01L 21/823821* (2013.01);
(Continued)

(58) Field of Classification Search
CPC ..... H01L 21/823878; H01L 21/823814; H01L 21/823821; H01L 29/785; H01L 29/66545;
(Continued)

(56) References Cited

U.S. PATENT DOCUMENTS

2006/0172497 A1* 8/2006 Hareland .......... H01L 29/66772
438/286
2015/0294874 A1* 10/2015 Lin .................... H01L 21/32133
257/401

* cited by examiner

Primary Examiner — Khaja Ahmad
Assistant Examiner — Pavel G Ivanov

(57) ABSTRACT

A semiconductor structure and a method for forming same, the forming method including: providing a base, where the base includes a substrate and a fin protruding from the substrate, an isolation layer is formed on the substrate exposed by the fin, and the isolation layer covers a part of side walls of the fin; forming a dummy gate structure across the fin, including a dummy gate layer, where the dummy gate structure covers a part of the top and a part of the side walls of the fin; forming an interlayer dielectric layer on the substrate exposed by the dummy gate structure, where the interlayer dielectric layer exposes the top of the dummy gate structure; removing the dummy gate layer and forming an opening in the interlayer dielectric layer; removing partial thickness of the isolation layer exposed by the opening and forming a groove in the isolation layer; and forming a gate structure in the groove and the opening, where the gate structure crosses the fin and covers a part of the top and a part of the side walls of the fin. Implementations of the present disclosure are advantageous for reducing the probability that source-drain punching through and OFF current leakage occur in the fin, and improving electrical properties of the semiconductor structure.

13 Claims, 7 Drawing Sheets

(51) Int. Cl.
*H01L 29/66* (2006.01)
*H01L 27/092* (2006.01)

(52) U.S. Cl.
CPC .... *H01L 27/0924* (2013.01); *H01L 29/66545* (2013.01); *H01L 29/66795* (2013.01); *H01L 29/785* (2013.01)

(58) Field of Classification Search
CPC ........... H01L 29/66795; H01L 27/0924; H01L 29/7855–7856; H01L 2029/7858
See application file for complete search history.

SEMICONDUCTOR STRUCTURE AND METHOD FOR THE FORMING SAME

RELATED APPLICATIONS

The present application claims priority to Chinese Patent Appln. No. 201910047290.8, filed Jan. 18, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

With the gradual development of semiconductor process and technology, the development trend that semiconductor process nodes follow the Moore's law is continuously reduced. In order to adapt the reduction in the process nodes, the length of channels of an MOSFET field effect transistor is also continually shortened. However, as the length of channels of a device shortens, the distance between the source electrode and the drain electrode of the device is accordingly shortened. Therefore, a channel controlling capability of the gate electrode deteriorates, and a difficulty in pinching the channels off by a gate voltage also becomes continuously larger, so that a phenomenon of sub-threshold leakage, that is, the so-called short-channel effect (SCE), may be easier to occur.

Therefore, in order to better meet the requirement of proportional reduction in the size of the device, the semiconductor process gradually transits from a planar MOSFET to a three-dimensional device with higher efficacy, such as a fin field effect transistor (FinFET). In the FinFET, the gate electrode may at least control an ultra-thin body (a fin) from two sides. Compared with the planar MOSFET, the gate electrode has a stronger channel controlling capability and can better suppress the short-channel effect. Moreover, compared with other devices, the FinFET has better compatibility with current integrated circuit manufacturing.

SUMMARY

A problem addressed by the embodiments and implementations of the present disclosure is to provide a semiconductor structure and a method for forming the same, so as to improve electrical properties of the semiconductor structure.

In order to address the foregoing problem, one form of the present disclosure provides a method for forming a semiconductor structure. The method may include: providing a base, where the base includes a substrate and a fin protruding from the substrate, an isolation layer is formed on the substrate exposed by the fin, and the isolation layer covers a part of side walls of the fin; forming a dummy gate structure across the fin, including a dummy gate layer, where the dummy gate structure covers a part of a top and a part of the side walls of the fin; forming an interlayer dielectric layer on the substrate exposed by the dummy gate structure, where the interlayer dielectric layer exposes a top of the dummy gate structure; removing the dummy gate layer and forming an opening in the interlayer dielectric layer; removing partial thickness of the isolation layer exposed by the opening and forming a groove in the isolation layer; and forming a gate structure in the groove and the opening, where the gate structure crosses the fin and covers a part of the top and a part of the side walls of the fin.

Another form of the present disclosure provides a semiconductor structure. The semiconductor structure may include: a substrate; a fin protruding from the substrate; an isolation layer located on the substrate exposed by the fin, where the isolation layer covers a part of side walls of the fin; and a gate structure crossing the fin and covering a part of the top and a part of the side walls of the fin, where the gate structure is further located in the isolation layer.

Compared with the prior art, technical solutions of some embodiments and implementations of the present disclosure have the following advantages:

In the field of semiconductors, the gate structure has a strong controlling capability over the top of the fin, and the closer to the bottom of the fin exposed by the isolation layer, the weaker the controlling capability of the gate structure over the fin. Therefore, problems of occurrence of source-drain punching through and OFF current leakage in a part close to the bottom of the fin exposed by the isolation layer are the severest. In the embodiments of the present disclosure, after the dummy gate layer is removed and the opening is formed in the interlayer dielectric layer, partial thickness of the isolation layer exposed by the opening is removed. After a groove is formed in the isolation layer and a gate structure is formed subsequently, the gate structure is further located in the groove. Compared with a solution that a groove is not formed in the isolation structure, the gate structure further covers a part of the side walls, which is located in the isolation layer, of the fin, thus enforcing the controlling capability of the gate structure over the fin and facilitating reduction in the probability that source-drain punching through and OFF current leakage occur in the fin. Moreover, compared with a solution that source-drain punching through and OFF current leakage are ameliorated by forming a punch-through stopper doping region, in some embodiments and implementations of the present disclosure, a step of performing ion doping to form a punch-through stopper doping region is omitted, thereby preventing the ion doping from diffusing during subsequent annealing treatment, avoiding the impact of random doping fluctuations on the electrical properties of the semiconductor structure, reducing the probability that variations occur to the semiconductor structure, and optimizing the electrical properties of the semiconductor structure.

In some implementations, before the groove is formed in the isolation layer, the forming method further includes: forming an inner wall layer on side walls of the opening. Therefore, partial thickness of the isolation layer exposed by the inner wall layer may be removed subsequently using the inner wall layer as a mask film, which is advantageous for reducing the loss of the isolation layer below the inner wall layer and ensures that there has sufficient distance between the source-drain doping layer and the groove. Subsequently, after the gate structure is formed in the groove and the opening, there also has sufficient distance between the source-drain doping layer and the gate structure located in the groove, thereby reducing the probability that a short circuit occurs because the distance between the gate structure and the source-drain doping layer is too short.

BRIEF DESCRIPTION OF THE DRAWINGS

The accompanying drawings constitute a part of this specification, describe exemplary embodiments and implementations of the present disclosure, and are used to explain the principles of the present disclosure together with this specification. In the accompanying drawings.

DETAILED DESCRIPTION

Figure 1:
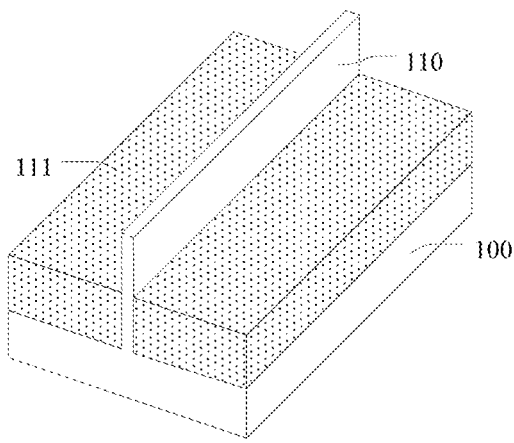
FIG. 1 to FIG. 19 are schematic structural diagrams corresponding to steps in one form of a method for forming a semiconductor structure.

In the field of semiconductors, generally, the gate structure merely covers a part of side walls, which protrudes from the isolation layer, of the fin, the gate structure has a strong controlling capability over the top of the fin, and the closer to the bottom of the fin exposed by the isolation layer, the weaker the controlling capability of the gate structure over the fin. Therefore, problems of occurrence of source-drain punching through and OFF current leakage in a part close to the bottom of the fin exposed by the isolation layer are the severest, thereby reducing the electrical properties of the semiconductor structure.

In order to ameliorate the foregoing problems, currently provided is a method for forming a semiconductor structure. After a substrate and a fin protruding from the substrate are formed, and an isolation layer is formed on the substrate exposed by the fin, ion doping treatment is performed at the bottom of the fin to form a punch-through stopper doping region. The type of the ion doping is opposite to the type of ion doping in a subsequent source-drain doping layer, so as to stop doped ions in the source-drain doping layer and thereby reduce a probability that source-drain punching through and OFF current leakage occur at the bottom of the fin.

However, in the field of semiconductors, generally, subsequent process steps further include a step of annealing treatment, and the doped ions in the punch-through stopper doping region may diffuse easily during subsequent annealing treatment, and then diffuse into a structure external to the fin, thereby resulting in a relatively high probability that variations occur to the semiconductor structure, and random doping fluctuations generated by the ion doping treatment may also reduce the electrical properties of the semiconductor structure.

In order to address the foregoing problems, one form of the present disclosure provides a method for forming a semiconductor structure. The method may include: providing a base, where the base includes a substrate and a fin protruding from the substrate, an isolation layer is formed on the substrate exposed by the fin, and the isolation layer covers a part of side walls of the fin; forming a dummy gate structure across the fin, including a dummy gate layer, where the dummy gate structure covers a part of a top and a part of the side walls of the fin; forming an interlayer dielectric layer on the substrate exposed by the dummy gate structure, where the interlayer dielectric layer exposes the top of the dummy gate structure; removing the dummy gate layer and forming an opening in the interlayer dielectric layer; removing partial thickness of the isolation layer exposed by the opening and forming a groove in the isolation layer; and forming a gate structure in the groove and the opening, where the gate structure crosses the fin and covers a part of the top and a part of the side walls of the fin.

In the field of semiconductors, the gate structure has a strong controlling capability over the top of the fin, and the closer to the bottom of the fin exposed by the isolation layer, the weaker the controlling capability of the gate structure over the fin. Therefore, problems of occurrence of source-drain punching through and OFF current leakage in a part close to the bottom of the fin exposed by the isolation layer are the severest. In some implementations of the present disclosure, after the dummy gate layer is removed and the opening is formed in the interlayer dielectric layer, partial thickness of the isolation layer exposed by the opening is removed. After a groove is formed in the isolation layer and a gate structure is formed subsequently, the gate structure is further located in the groove. Compared with a solution that a groove is not formed in the isolation structure, the gate structure further covers a part of the side walls, which is located in the isolation layer, of the fin, thus enforcing the controlling capability of the gate structure over the fin and facilitating reduction in the probability that source-drain punching through and OFF current leakage occur in the fin. Moreover, compared with a solution that source-drain punching through and OFF current leakage are ameliorated by forming a punch-through stopper doping region, in implementations of the present disclosure, a step of performing ion doping to form a punch-through stopper doping region is omitted, thereby preventing the ion doping from diffusing in subsequent annealing treatment, avoiding the impact of random doping fluctuation on the electrical properties of the semiconductor structure, reducing the probability that variations occur to the semiconductor structure, and optimizing the electrical properties of the semiconductor structure.

To make the foregoing objectives, features and advantages of the embodiments of the present disclosure easier to understand, the specific embodiments of the present disclosure are described in detail below with reference to the accompanying drawings.

FIG. 1 to FIG. 19 are schematic structural diagrams corresponding to steps in one form of a method for forming a semiconductor structure.

Referring to FIG. 1, a perspective view is shown. A base is provided. The base includes a substrate 100 and a fin 110 protruding from the substrate 100, an isolation layer 111 is formed on the substrate 100 exposed by the fin 110, and the isolation layer 111 covers a part of side walls of the fin 110.

The substrate 100 is used for providing a process platform for forming a semiconductor structure subsequently.

In some implementations, the substrate 100 is a silicon substrate. In other implementations, a material of the substrate may also be germanium, silicon germanide, silicon carbide, gallium arsenide, indium gallide or the like.

The fin 110 is used for providing a conducting channel of a fin field effect transistor subsequently.

In some implementations, the fin 110 and the substrate 100 are obtained by etching the same semiconductor layer. In other implementations, the fin may also be a semiconductor layer epitaxially grown on the substrate, thereby achieving an objective of controlling the height of the fin precisely.

Therefore, in some implementations, a material of the fin 110 is the same as the material of the substrate 100, and the material of the fin 110 is silicon. In other implementations, the material of the fin may also be germanium, silicon germanide, silicon carbide, gallium arsenide or indium gallide.

The isolation layer 111 is used for performing electrical isolation between adjacent devices.

In some implementations, a material of the isolation layer 111 is silicon oxide. In other implementations, the material of the isolation structure may also be an insulating material such as silicon nitride, silicon oxynitride, silicon oxycarbide, silicon carbonitride or silicon oxy-carbonitride.

Figure 2:
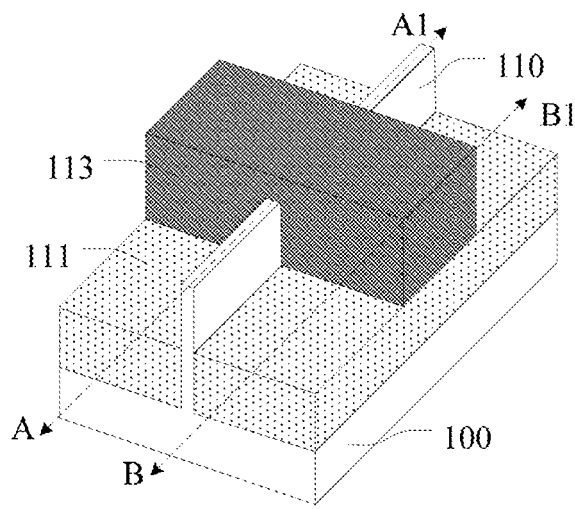
Figure 3:
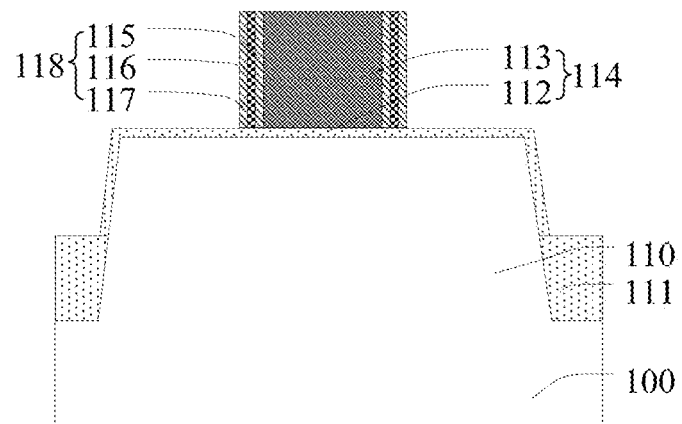
Figure 4:
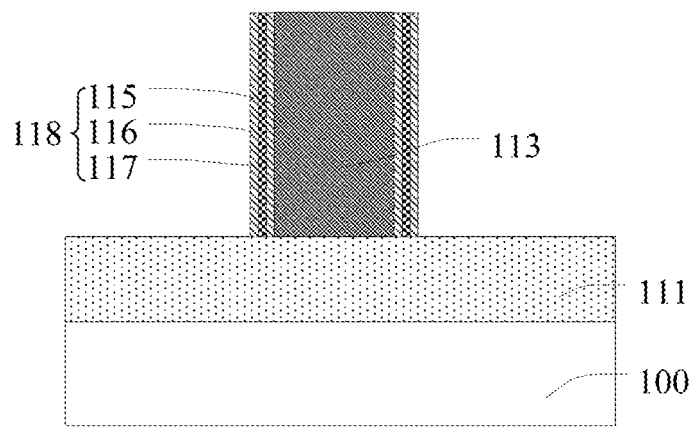

Referring to FIG. 2 to FIG. 4, a perspective view, a cross-sectional view along a direction of AA1 in FIG. 2 and a cross-sectional view along a direction of BB1 in FIG. 2 are shown respectively. A dummy gate structure 114 across the fin 110 is formed, including a dummy gate layer 113. The dummy gate structure 114 covers a part of the top and a part of the side walls of the fin 110.

The dummy gate structure 114 occupies a spatial position for forming a gate structure subsequently.

A material of the dummy gate layer 113 may be polysilicon, silicon oxide, silicon nitride, silicon oxynitride, silicon carbide, silicon carbonitride, silicon oxy-carbonitride or amorphous carbon. In some implementations, the material of the dummy gate layer 113 is polysilicon.

It should be noted that in some implementations, the dummy gate structure 114 further includes a dummy gate oxide layer 112 (as shown in FIG. 3) located at the bottom of the dummy gate layer 113.

A material of the dummy gate oxide layer 112 may be silicon oxide or silicon oxynitride. In some implementations, the material of the dummy gate oxide layer 112 is silicon oxide.

In some implementations, the dummy gate oxide layer 112 further covers the surface of the fin 110 exposed by the dummy gate layer 113. In some other implementations, the dummy gate oxide layer may also be located at the bottom of the dummy gate layer and a spacer. In other implementations, the dummy gate structure may also include the dummy gate layer merely.

It should be further noted that for the ease of illustration and description, in some implementations, the substrate 100, the fin 110, the isolation layer 111 and the dummy gate layer 113 in the dummy gate structure 114 are merely shown in FIG. 2.

Referring to FIG. 3 to FIG. 4 in combination, in some implementations, after the dummy gate structure 114 is formed, the forming method further includes: forming spacers 118 on side walls of the dummy gate structure 114.

The spacers 118 are used for protecting side walls of the dummy gate layer 113 in subsequent process steps, and the spacers 118 are further used for defining regions for forming a source-drain doping layer subsequently.

In some implementations, the spacer 118 is of a laminate structure, and the spacer 118 correspondingly includes first spacers 115 located on the side walls of the dummy gate structure 114, second spacers 116 located on side walls of the first spacers 115 and third spacers 117 located on side walls of the second spacers 116. In other implementations, the spacer may also be of a single structure.

In some implementations, materials of the first spacer 115 and the third spacer 117 are silicon oxide, and a material of the second spacer 116 is silicon nitride.

Figure 5:
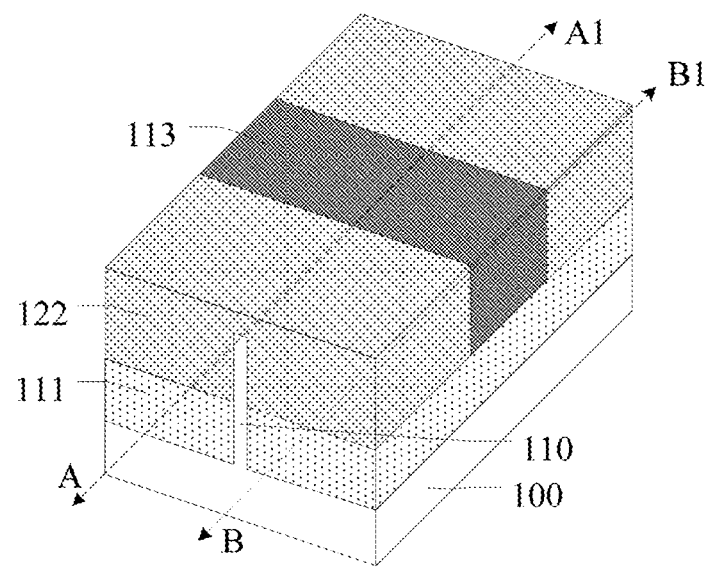
Figure 6:
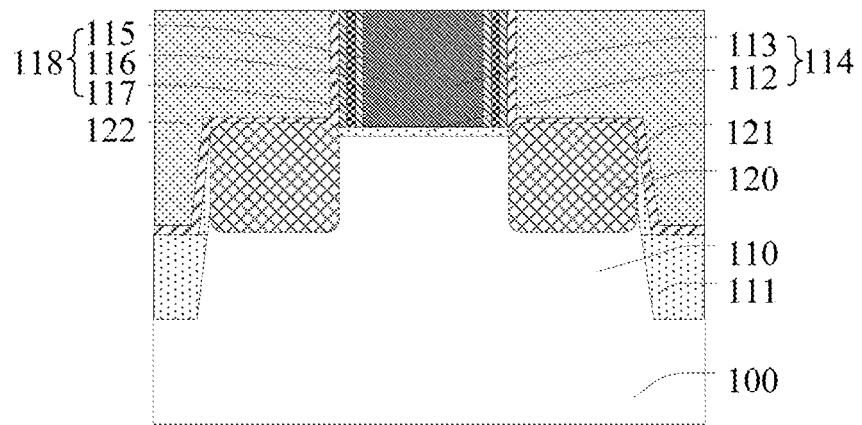
Figure 7:
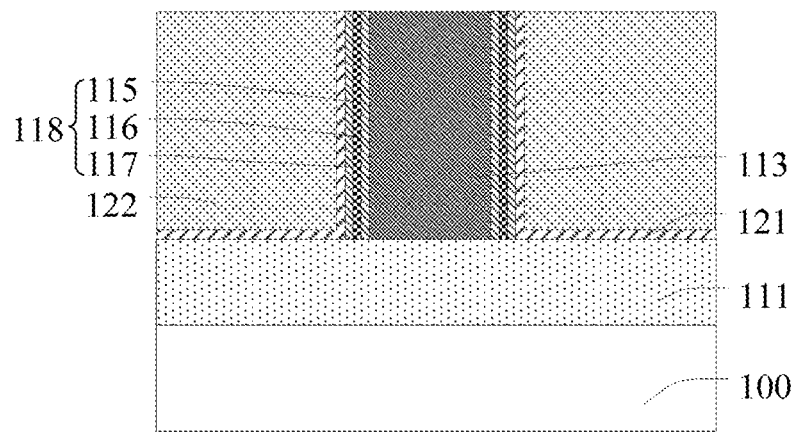

Referring to FIG. 5 to FIG. 7, a perspective view, a cross-sectional view along the direction of AA1 in FIG. 5 and a cross-sectional view along the direction of BB1 in FIG. 5 are shown respectively. An interlayer dielectric layer 122 is formed on the substrate 100 exposed by the dummy gate structure 114. The interlayer dielectric layer 122 exposes the top of the dummy gate structure 114.

The interlayer dielectric layer 122 is used for performing isolation between adjacent devices, and the interlayer dielectric layer 122 is further used for providing a process platform for forming a gate structure subsequently.

Therefore, a material of the interlayer dielectric layer 122 is an insulating material, for example, one or more of silicon oxide, silicon nitride, silicon oxynitride, silicon oxycarbide, silicon carbonitride, and silicon oxy-carbonitride.

In some implementations, the interlayer dielectric layer 122 is of a single structure, and the material of the interlayer dielectric layer 122 is silicon oxide.

Referring to FIG. 6 in combination, it should be noted that after the dummy gate structure 114 is formed and before the interlayer dielectric layer 122 is formed on the substrate 100 exposed by the dummy gate structure 114, the forming method further includes: forming a source-drain doping layer 120 in fins 110 on two sides of the dummy gate structure 114.

In some implementations, the source-drain doping layer 120 is formed by an epitaxial process.

When an NMOS transistor is formed, the source-drain doping layer 120 includes a stress layer doped with N-type ions, a material of the stress layer is Si or SiC, and the stress layer provides a tensile stress function for a channel region of the NMOS transistor, thereby facilitating improving the carrier mobility of the NMOS transistor, where the N-type ions are P ions, As ions or Sb ions. When a PMOS transistor is formed, the source-drain doping layer 120 includes a stress layer doped with P-type ions, a material of the stress layer is Si or SiGe, and the stress layer provides a compressive stress function for a channel region of the PMOS transistor, thereby facilitating improving the carrier mobility of the PMOS transistor, where the P-type ions are B ions, Ga ions or In ions.

It should be further noted that Referring to FIG. 6 and FIG. 7 in combination, in some implementations, after the source-drain doping layer 120 is formed and before the interlayer dielectric layer 122 is formed, the forming method further includes: forming an etch stop layer 121 covering the surface of the source-drain doping layer 120 in a conformal manner. The etch stop layer 121 further covers the surface of the isolation layer 111 and the dummy gate oxide layer 112 and the side walls of the third spacer 117 in a conformal manner.

In some implementations, the etch stop layer 121 is a contact etch stop layer (CESL) and used for defining an etch stop position of a subsequent contact etch process, thereby facilitating reduction in damage to the source-drain doping layer 120 caused by the contact etch process.

In some implementations, a material of the etch stop layer 121 is silicon nitride. The silicon nitride material has a relatively large density and relatively high hardness, thereby ensuring that the etch stop layer 121 may function in defining the etch stop position of the subsequent contact etch process.

Therefore, in some implementations, in the step of forming the interlayer dielectric layer 122, the interlayer dielectric layer 122 covers the etch stop layer 121.

Figure 8:
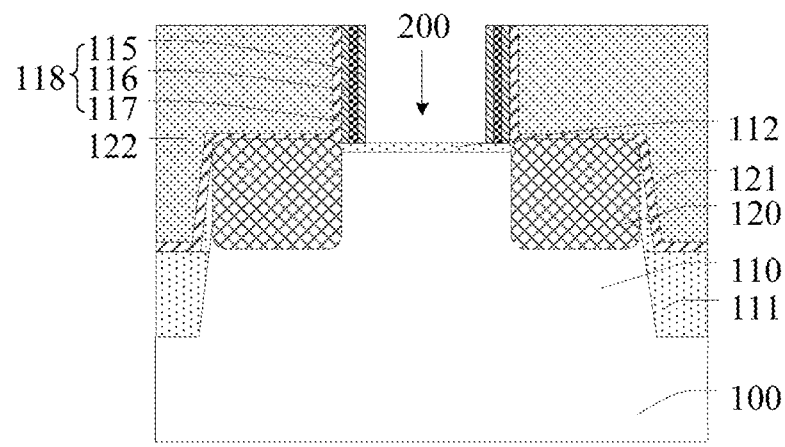
Figure 9:
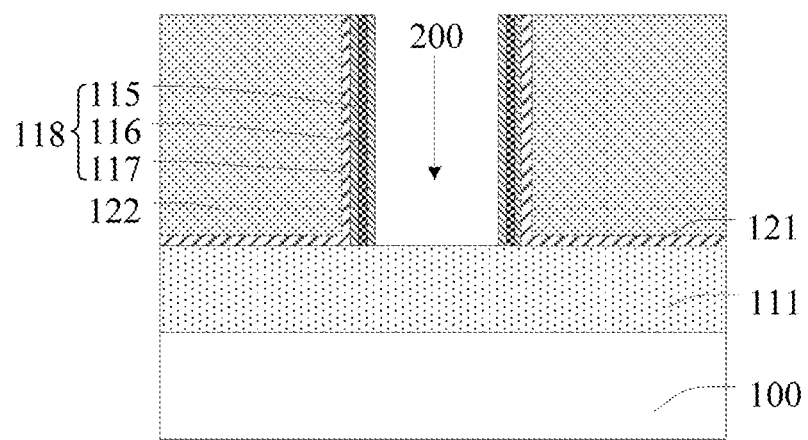

Referring to FIG. 8 to FIG. 9, FIG. 8 is a cross-sectional view based on FIG. 6, and FIG. 9 is a cross-sectional view based on FIG. 7. The dummy gate layer 113 (as shown in FIG. 7) is removed and an opening 200 is formed in the interlayer dielectric layer 122.

The opening 200 is used for providing a spatial position for forming a gate structure subsequently, and the opening 200 is further used for providing a process platform for removing partial thickness of the isolation layer 111 subsequently.

Specifically, the dummy gate layer 113 is removed using a process combining dry etching with wet etching, which is advantageous for reducing damage to the dummy gate oxide layer 112 while improving production capacity, especially damage to the dummy gate oxide layer 112 below the spacer 118, thereby facilitating reduction in the probability that a short circuit occurs to the gate structure and the source-drain doping layer 120 subsequently, while removing the dummy gate layer 113 completely and enabling a cross section of the opening 200 to meet process requirements.

Figure 11:
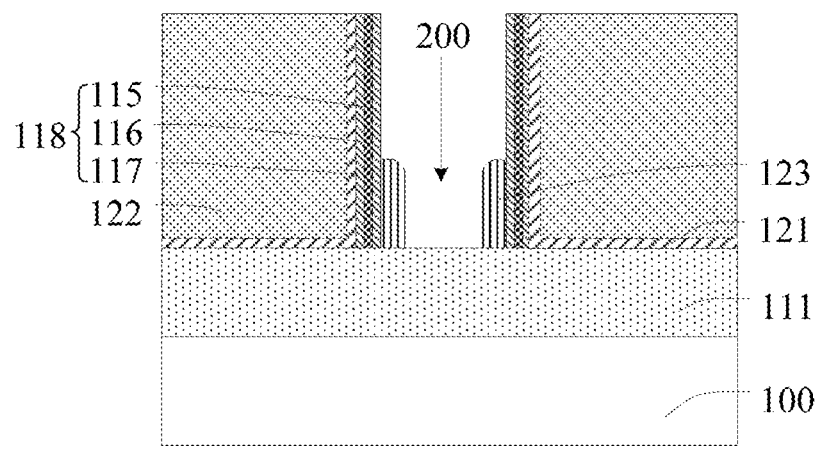
Figure 12:
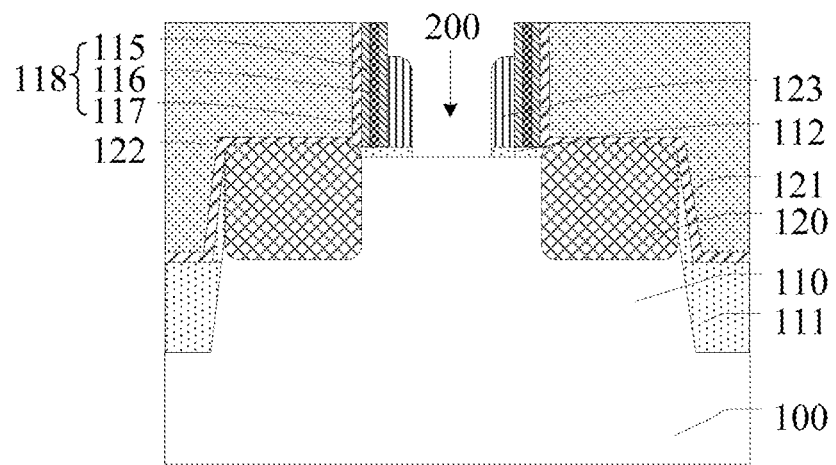
Figure 13:
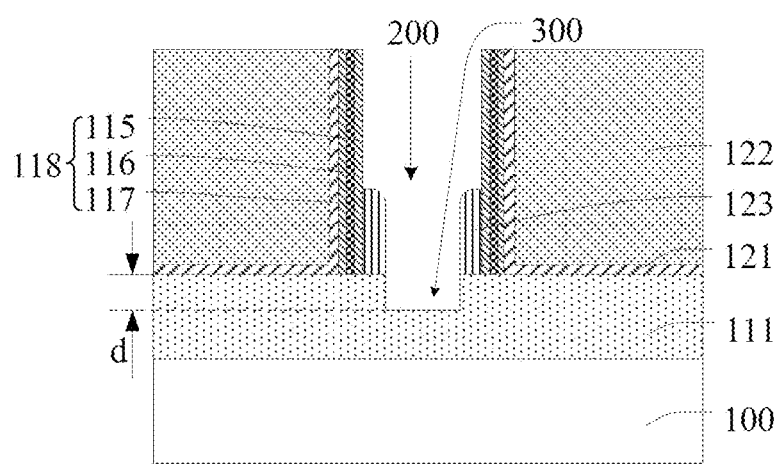

Referring to FIG. 10 to FIG. 17, partial thickness of the isolation layer 111 exposed by the opening 200 is removed and a groove 300 (as shown in FIG. 13) is formed in the isolation layer 111.

In the field of semiconductors, the gate structure has a strong controlling capability over the top of the fin, and the closer to the bottom of the fin exposed by the isolation layer, the weaker the controlling capability of the gate structure over the fin. Therefore, problems of occurrence of source-drain punching through and OFF current leakage in a part close to the bottom of the fin exposed by the isolation layer are the severest. In some implementations of the present disclosure, after the opening 200 is formed in the interlayer dielectric layer 122, partial thickness of the isolation layer 111 exposed by the opening 200 is removed. After a groove 300 is formed in the isolation layer 111 and a gate structure is formed subsequently, the gate structure is further located in the groove 300. Compared with a solution that a groove is not formed in the isolation structure, the gate structure further covers a part of the side walls, which is located in the isolation layer 111, of the fin 110, thus enforcing the controlling capability of the gate structure over the fin 110 and facilitating reduction in the probability that source-drain punching through and OFF current leakage occur in the fin 110. Moreover, compared with a solution that source-drain punching through and OFF current leakage are ameliorated by forming a punch-through stopper doping region, in some implementations of the present disclosure, a step of performing ion doping to form a punch-through stopper doping region is omitted, thereby preventing the ion doping from diffusing in subsequent annealing treatment, avoiding the impact of random doping fluctuation on the electrical properties of the semiconductor structure, reducing the probability that variations occur to the semiconductor structure, and optimizing the electrical properties of the semiconductor structure.

It should be noted that in some implementations, the depth d (as shown in FIG. 13) of the groove 300 should not be too small or too large. If the depth d of the groove 300 is too small, the effect of improving the controlling capability of the gate structure over the fin 110 is not obvious, thus resulting in reduction in the effect of ameliorating the problems of source-drain punching through and OFF current leakage. If the depth d of the groove 300 is too large, the remaining thickness of the isolation layer 111 at the bottom of the groove 300 is correspondingly relatively small, the difficulty in forming the gate structure in the groove 300 subsequently is relatively large, and the probability of generating defects such as empty holes during forming the gate structure is relatively high. Moreover, if the depth d of the groove 300 is too large, the distance between the gate structure and the substrate 100 may be too short subsequently, and parasitic capacitance formed by the gate electrode and the substrate 100 may be relatively large. To this end, in some implementations, the depth d of the groove 300 is 5 nm to 20 nm.

In some implementations, the bottom of the groove 300 is lower than the bottom of the source-drain doping layer 120.

With the bottom of the groove 300 being lower than the bottom of the source-drain doping layer 120, after the gate structure is formed in the opening 200 and the groove 300, the bottom of the gate structure is lower than the bottom of the source-drain doping layer 120, thereby further increasing the controlling capability of the gate structure over the fin 110, and thus facilitating the further improvement on the effect of ameliorating the problems of source-drain punching through and OFF current leakage.

Figure 10:
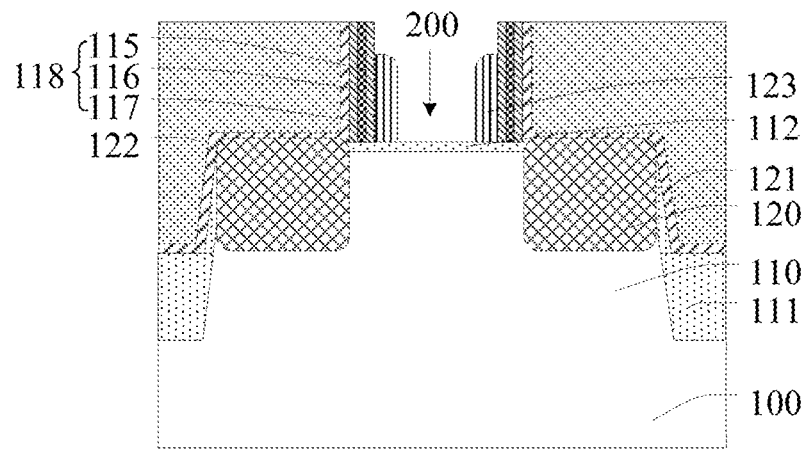

Referring to FIG. 10 and FIG. 11 in combination, FIG. 10 is a cross-sectional view based on FIG. 8, and FIG. 11 is a cross-sectional view based on FIG. 9. It should be noted that in some implementations, before the groove 300 is formed in the isolation layer 111, the forming method further includes: forming an inner wall layer 123 on side walls of the opening 200.

By forming an inner wall layer 123 on side walls of the opening 200, partial thickness of the isolation layer 111 exposed by the inner wall layer 123 may be removed subsequently by using the inner wall layer 123 as a mask film, which facilitates the reduction in the loss of the isolation layer 111 below the inner wall layer 123 and ensures that there has sufficient distance between the groove and the source-drain doping layer 120 subsequently. After the gate structure is formed in the groove 300 and the opening 200 subsequently, there also has sufficient distance between the source-drain doping layer 120 and the gate structure in the groove, thereby reducing the probability that a short circuit occurs because the distance between the gate structure and the source-drain doping layer 120 is too short.

Moreover, in some implementations, a dummy gate oxide layer 112 is also formed on the surface of the fin 110, and materials of the dummy gate oxide layer 112 and the isolation layer 111 are the same. Therefore, settings of the inner wall layer 123 may also reduce the probability that the dummy gate oxide layer 112 below the spacer 118 has loss during forming the groove 300, thereby further reducing the probability that a short circuit occurs to the gate structure and the source-drain doping layer 120.

It should be noted that in the step of forming the inner wall layer 123 on the side walls of the opening 200, along a direction perpendicular to the side walls of the opening 200, the width of the inner wall layer 123 should not be too small or too large. If the width of the inner wall layer 123 is too small, in a subsequent step of removing partial thickness of the isolation layer 111 exposed by the inner wall layer 123, loss may occur to the inner wall layer 123 easily, thereby having difficulty in reducing the loss of the dummy gate oxide layer 112 and the isolation layer 111 below the inner wall layer 123. If the width of the inner wall layer 123 is too large, the opening width of the groove formed in the isolation layer 111 subsequently may be too small correspondingly, thereby resulting in too small a width of the gate structure located in the groove subsequently, and reducing the function of the gate structure located in the groove for ameliorating the problems of source-drain punching through and OFF current leakage. To this end, in some implementations, the width of the inner wall layer 123 is 3 nm to 10 nm.

In order to reduce the impact of the inner wall layer 123 on subsequent process procedures, in some implementations, the inner wall layer 123 is of a material easy to be removed. Specifically, a material of the inner wall layer 123 may be amorphous carbon or amorphous germanium. In some implementations, the material of the inner wall layer 123 is amorphous carbon.

The amorphous carbon is a material easy to be obtained, which is advantageous for reducing the process cost of forming the inner wall layer 123. Moreover, the amorphous carbon material may be removed by an oxidization process subsequently, which is advantageous for reducing the difficulty and complexity of process operations for removing the inner wall layer 123 subsequently.

Specifically, in some implementations, the step of forming the inner wall layer 123 includes: forming an inner wall material layer (not shown) covering the bottom and the side walls of the opening 200 in a conformal manner; removing the inner wall material layer located at the bottom of the opening 200; and retaining the remaining inner wall material layer located on the side walls of the opening 200 as the inner wall layer 123.

In some implementations, the inner wall material layer is formed using an atom layer deposition process. The use of the atom layer deposition process is advantageous for improving the thickness uniformity of the inner wall material layer, so that the thickness of the inner wall layer 123 may be controlled precisely. Moreover, the atom layer deposition process has good gap filling performance and stepped covering property, thereby improving a conformal covering capability of the inner wall material layer correspondingly. In other implementations, the inner wall material layer may also be formed by using a chemical vapor deposition process.

Since the inner wall material layer covers the bottom and the side walls of the opening 200 in a conformal manner, in some implementations, the inner wall material layer at the bottom of the opening 200 may be removed by using a mask film-free dry etch process, and a mask is not required for the step of forming the inner wall layer 123, thereby reducing the process cost.

Moreover, the use of the dry etch process is advantageous for improving the anisotropy of an etch process, thereby reducing the probability of etching the inner wall material layer on the side walls of the opening 200 transversely while ensuring that the inner wall material layer at the bottom of the opening 200 is removed, so that the width of the inner wall layer 123 may meet process requirements.

After the inner wall layer 123 is formed, referring to FIG. 12 and FIG. 13, FIG. 12 is a cross-sectional view based on FIG. 10, and FIG. 13 is a cross-sectional view of FIG. 11. Correspondingly, the step of forming the groove 300 in the isolation layer 111 includes: removing the dummy gate oxide layer 112 and the partial thickness of the isolation layer 111 exposed by the inner wall layer 123 by using the inner wall layer 123 as a mask film.

In some implementations, the dummy gate oxide layer 112 and the partial thickness of the isolation layer 111 exposed by the inner wall layer 123 are removed by using the dry etch process. The dry etch process has the property of anisotropic etching, and an etched cross section has better controlling property, which is advantageous for enabling a cross section of the groove 300 to meet process requirements, thereby reducing the probability that the isolation layer 111 has transverse loss during forming the groove 300. In other implementations, according to actual process requirements, the dummy gate oxide layer and the partial thickness of the isolation layer exposed by the inner wall layer may also be removed using a wet etch process or an etch process combining the wet etch process with the dry etch process.

Therefore, in some implementations, after the dummy gate oxide layer 112 and the isolation layer 111 exposed by the inner wall layer 123 are removed, along an extending direction of the fin 110, the cross section of the groove 300 is rectangular. In other implementations, according to actual processes, along the extending direction of the fin, the cross section of the groove may also be of an inverted trapezoid or other shapes.

Figure 14:
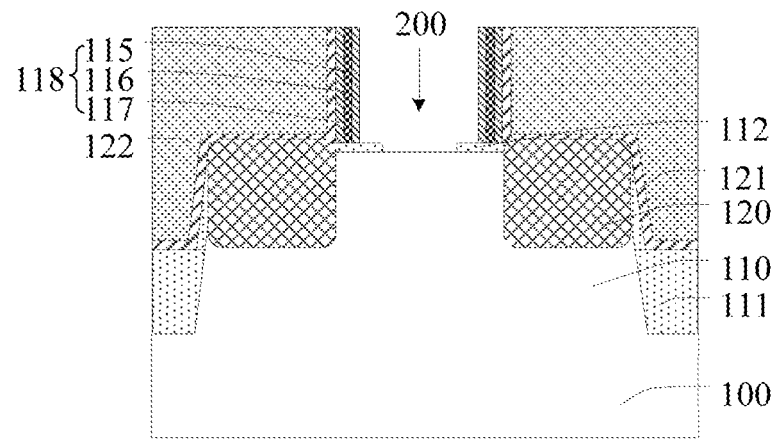
Figure 15:
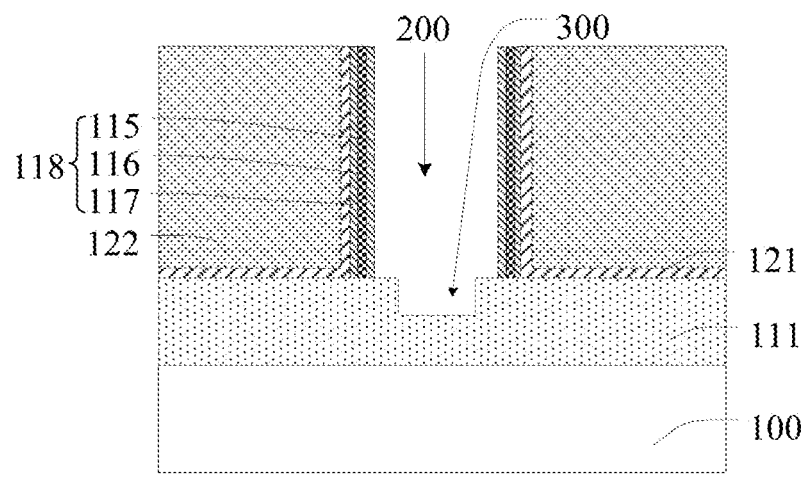

It should be noted that Referring to FIG. 14 and FIG. 15 in combination, FIG. 14 is a cross-sectional view based on FIG. 12, and FIG. 15 is a cross-sectional view based on FIG. 13. After the groove 300 is formed in the isolation layer 111, the forming method further includes: removing the inner wall layer 123 (as shown in FIG. 13).

The inner wall layer 123 is removed, thereby providing a process foundation for removing the remaining dummy gate oxide layer 112 exposed by the opening 200.

In some implementations, a material of the inner wall layer 123 is amorphous carbon. Therefore, during removing the inner wall layer 123 by using an oxidization process, process steps are simple, process cost is low, and side effects would not be generated easily. In other implementations, when the material of the inner wall layer is amorphous germanium, the inner wall layer is removed using the wet etch process.

Figure 16:
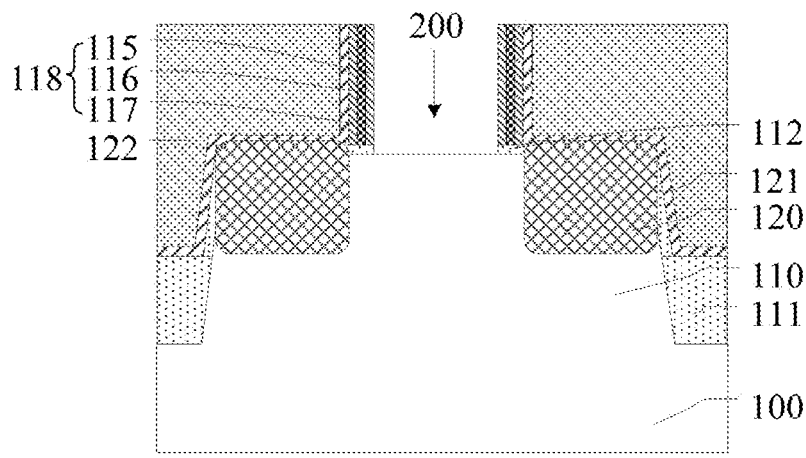
Figure 17:
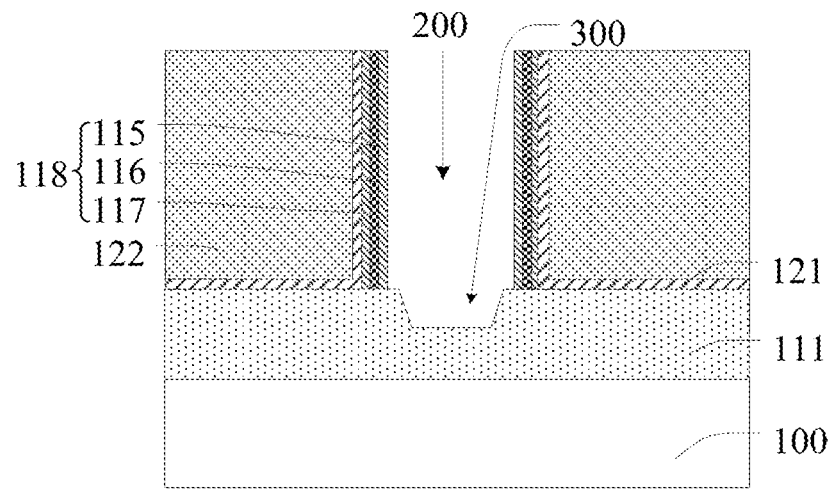

It should be further noted that, referring to FIG. 16 and FIG. 17 in combination, FIG. 16 is a cross-sectional view based on FIG. 14, and FIG. 17 is a cross-sectional view based on FIG. 15. After the inner wall layer 123 is removed, the forming method further includes: removing the remaining dummy gate oxide layer 112 exposed by the opening 200.

With the remaining dummy gate oxide layer 112, the fin 110 below the remaining dummy gate oxide layer 112 is exposed, thereby providing a process foundation for forming a gate structure across the fin 110 subsequently.

In some implementations, the remaining dummy gate oxide layer 112 exposed by the opening 200 is removed by using the wet etch process. The wet etch process has the property of anisotropic etching, and the remaining dummy gate oxide layer 112 covers a part of the top and a part of side walls of the fin 110 exposed by the opening 200. Therefore, the use of the wet etch process is advantageous for completely removing the remaining dummy gate oxide layer 112 on the part of the top and the part of the side walls of the fin 110 exposed by the opening 200. Moreover, steps of the wet etch process are simple, which is advantageous for reducing process complexity. In other implementations, according to actual process requirements, the remaining dummy gate oxide layer exposed by the opening may be removed using drying etching or a process combining wet etching and dry etching correspondingly.

It should be noted that since materials of the dummy gate oxide layer 112 and the isolation layer 111 are the same, in the step of removing the remaining dummy gate oxide layer 112 exposed by the opening 200, the isolation layer 111 may also be etched; since the wet etch process used in some implementations has the property of anisotropic etching, the wet etch process may also etch the isolation layer 111 on side walls of the groove 300 transversely; and since an etching solution is difficult to reach the bottom of the groove 300, the closer the bottom of the groove 300, the slower an etching rate of the wet etch process for the isolation layer 111 on the side walls of the groove 300. Therefore, as shown in FIG. 17, after the remaining dummy gate oxide layer 112 exposed by the opening 200 is removed, along the extending direction of the fin 110, a cross section of the groove 300 is of an inverted trapezoid.

The cross section of the groove 300 is of an inverted trapezoid, and therefore, after forming the gate structure in the groove 300 and the opening 200 subsequently, the closer to the bottom of the groove 300, the larger the distance between the gate structure and the source-drain doping layer 120, which is advantageous for further reducing the probability that a short circuit occurs to the gate structure and the source-drain doping layer 120. In other implementations, according to actual processes, after the remaining dummy gate oxide layer exposed by the opening is removed, along the extending direction of the fin, the cross section of the groove may also be of a rectangle or other shapes.

In some implementations, the etching solution is a hydrofluoric acid solution. The material of the dummy gate oxide layer 112 is silicon oxide, and a diluted hydrofluoric acid solution is a solution commonly used for etching silicon oxide in a semiconductor process, which is advantageous for improving process compatibility and reducing process cost.

The volume percent of hydrofluoric acid in the diluted hydrofluoric acid solution should not be too small or too large. If the volume percent is too small, the etching rate may be too small easily, thereby reducing production capacity. If the volume percent is too large, etching stability and etching uniformity of the wet etch process may be reduced easily, and the etching amount of the dummy gate oxide layer 112 and the isolation layer 111 may exceed a pre-set range easily. To this end, in some implementations, the volume percent of hydrofluoric acid in the diluted hydrofluoric acid solution is 0.5% to 5%.

In some implementations, the wet etch process is performed at normal temperature, and the etching solution is not required to be heated, which simplifies process procedures and preventing over temperature or under temperature from having an adverse effect on the semiconductor structure. The normal temperature refers to room temperature in a manufacturing workshop.

The etching time of the wet etch process should not be too short or too long. If the etching time is too short, the dummy gate oxide layer 112 exposed by the opening 200 is difficult to be removed completely. If the etching time is too long, over etching may occur to the isolation layer 111 easily, and long etching time may reduce production capacity easily and increase process risks. To this end, in some implementations, the remaining dummy gate oxide layer 112 exposed by the opening 200 is removed by repeating the wet etch process, the number of times of repeating the wet etch process is 3 to 5, and the etching time is 5 seconds to 10 seconds for each time, so that it is advantageous for completely removing the dummy gate oxide layer 112 exposed by the opening 200 and the uniformity and stability of etching procedures may be improved.

It should be noted that, in some implementations, after the remaining dummy gate oxide layer 112 exposed by the opening 200 is removed, along the extending direction of the fin 110, the width of the top of the groove 300 is less than the width of the opening 200. In other implementations, according to actual process requirements, after the remaining dummy gate oxide layer exposed by the opening is removed, along the extending direction of the fin, the opening width of the top of the groove may also be equal to the width of the opening.

Figure 18:
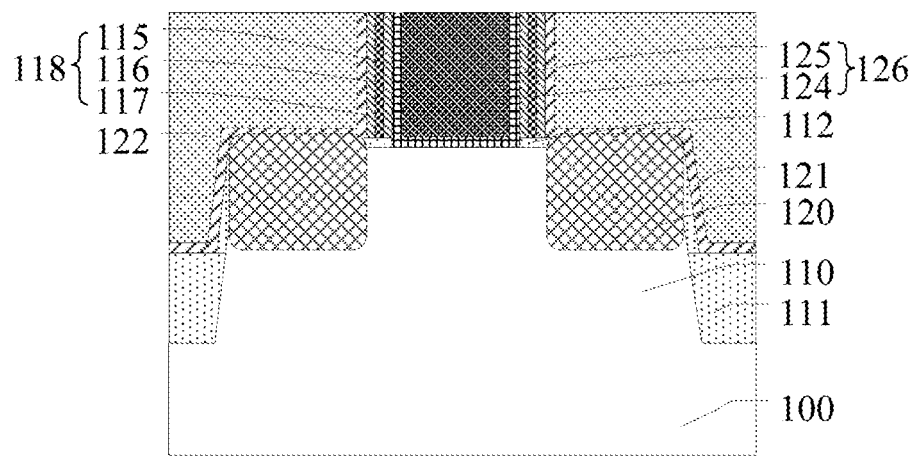
Figure 19:
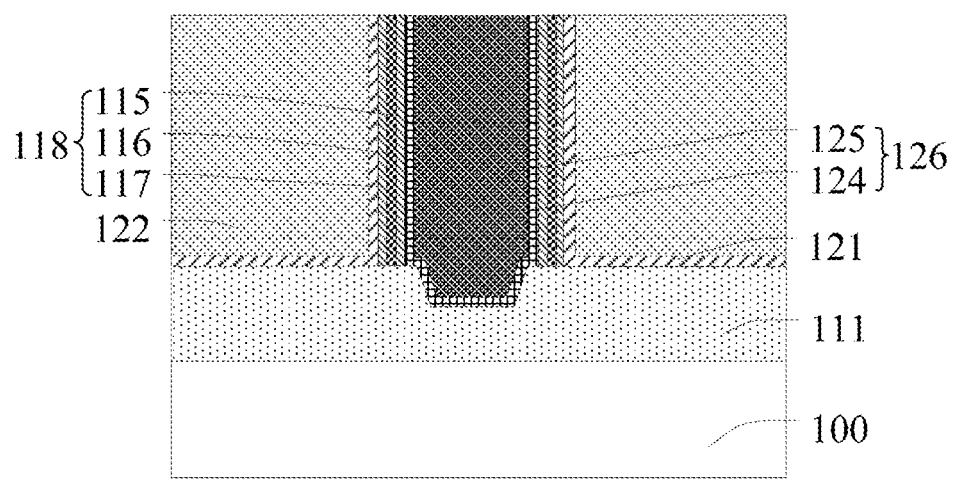

Referring to FIG. 18 to FIG. 19, FIG. 18 is a cross-sectional view based on FIG. 16, and FIG. 19 is a cross-sectional view based on FIG. 17. A gate structure 126 is formed in the groove 300 and the opening 200. The gate structure 126 crosses the fin 110 and covers a part of the top and a part of side walls of the fin 110.

The gate structure 126 is used for controlling the opening and closing of a conducting channel of a fin field effect transistor.

Compared with the solution that a groove is not formed in the isolation layer, the gate structure 126 formed in some implementations is further located in the groove 300, and the gate structure 126 further covers a part of side walls, which is located in the isolation layer 111, of the fin 110, thus enforcing the controlling capability of the gate structure 126 over the fin 110, facilitating reduction in the probability that source-drain punching through and OFF current leakage occur in the fin 110, and improving the electrical properties of the semiconductor structure.

In some implementations, the gate structure 126 is a metal gate structure, and therefore, the step of forming the gate structure 126 includes: forming a high k dielectric layer 124 covering, in a conformal manner, the bottom and the side walls of the groove 300 and the side walls of the opening 200 exposed by the groove 300; and after forming the high k dielectric layer 124, forming a gate electrode layer 125 in the groove 300 and the opening 200, where the high k dielectric layer 124 and the gate electrode layer 125 located on the high k dielectric layer 124 form the gate structure 126.

A material of the high k gate dielectric layer 124 is a high k gate dielectric material, where the high k gate dielectric material refers to a gate dielectric material with a relative dielectric constant greater than a relative dielectric constant of silicon oxide, and the high k gate dielectric material may be $HfO_2$, HfSiO, HfSiON, HfTaO, HfTiO, HfZrO, $ZrO_2$ or $Al_2O_3$. In some implementations, the material of the high k gate dielectric layer 124 is $HfO_2$.

A material of the gate electrode layer 125 is Al, Cu, Ag, Au, Pt, Ni, Ti or W. In some implementations, the material of the gate electrode layer 125 is W correspondingly.

Correspondingly, the present disclosure further provides a semiconductor structure. Referring to FIG. 18 and FIG. 19, schematic structural diagrams of an embodiment of a semiconductor structure according to the present disclosure are shown. FIG. 18 is a cross-sectional view along an extending direction of a fin in a position at the top of the fin, and FIG. 19 is a cross-sectional view along an extending direction of a fin in a position on one side of the fin.

The semiconductor structure includes: a substrate 100; a fin 110 protruding from the substrate 100; an isolation layer 111 located on the substrate 100 exposed by the fin 110, where the isolation layer 111 covers a part of side walls of the fin 110; and a gate structure 126 crossing the fin 110 and covering a part of the top and a part of the side walls of the fin 110, where the gate structure 126 is further located in the isolation layer 111.

In the field of semiconductors, the gate structure has a strong controlling capability over the top of the fin, and the closer to the bottom of the fin exposed by the isolation layer, the weaker the controlling capability of the gate structure over the fin. Therefore, problems of occurrence of source-drain punching through and OFF current leakage in a part close to the bottom of the fin exposed by the isolation layer are the severest. In the embodiments of the present disclosure, the gate structure 126 is further located in the isolation layer 111. Compared with a solution that the gate structure is not located in the isolation layer, the gate structure 126 further covers a part of the side walls, which is located in the isolation layer 111, of the fin 110, thus enforcing the controlling capability of the gate structure 126 over the fin 110 and facilitating reduction in the probability that source-drain punching through and OFF current leakage occur in the fin 110. Moreover, compared with a solution that source-drain punching through and OFF current leakage are ameliorated by forming a punch-through stopper doping region, in some implementations of the present disclosure, a step of performing ion doping to form a punch-through stopper doping region is omitted, thereby preventing the ion doping from diffusing in subsequent annealing treatment, avoiding the impact of random doping fluctuation on the electrical properties of the semiconductor structure, reducing the probability that variations occur to the semiconductor structure, and optimizing the electrical properties of the semiconductor structure.

The substrate 100 is used for providing a process platform for forming a semiconductor structure.

In some implementations, the substrate 100 is a silicon substrate. In other implementations, a material of the substrate may also be germanium, silicon germanide, silicon carbide, gallium arsenide, indium gallide or the like.

The fin 110 is used for providing a conducting channel of a fin field effect transistor subsequently.

In some implementations, the fin 110 and the substrate 100 are obtained by etching the same semiconductor layer. In other implementations, the fin may also be a semiconductor layer epitaxially grown on the substrate, thereby achieving an objective of controlling the height of the fin precisely.

Therefore, in some implementations, a material of the fin 110 is the same as the material of the substrate 100, and the material of the fin 110 is silicon. In other implementations, the material of the fin may also be germanium, silicon germanide, silicon carbide, gallium arsenide or indium gallide.

The isolation layer 111 is used for performing electrical isolation between adjacent devices.

In some implementations, a material of the isolation layer 111 is silicon oxide. In other implementations, the material of the isolation structure may also be an insulating material such as silicon nitride, silicon oxynitride, silicon oxycarbide, silicon carbonitride or silicon oxy-carbonitride.

It should be noted that the semiconductor structure further includes: a source-drain doping layer 120 located in the fins 110 on two sides of the gate structure 126.

When the semiconductor structure is an NMOS transistor, the source-drain doping layer 120 includes a stress layer doped with N-type ions, a material of the stress layer is Si or SiC, and the stress layer provides a tensile stress function for a channel region of the NMOS transistor, thereby facilitating improving the carrier mobility of the NMOS transistor, where the N-type ions are P ions, As ions or Sb ions. When the semiconductor structure is a PMOS transistor, the source-drain doping layer 120 includes a stress layer doped with P-type ions, a material of the stress layer is Si or SiGe, and the stress layer provides a compressive stress function for a channel region of the PMOS transistor, thereby facilitating improving the carrier mobility of the PMOS transistor, where the P-type ions are B ions, Ga ions or In ions.

The gate structure 126 is used for controlling the opening and closing of a conducting channel of a fin field effect transistor.

In some implementations, the gate structure 126 is a metal gate structure, and therefore, the gate structure 126 includes a high k dielectric layer 124 and a gate electrode layer 125 located on the high k dielectric layer 124.

A material of the high k gate dielectric layer 124 is a high k gate dielectric material, where the high k gate dielectric material refers to a gate dielectric material with a relative dielectric constant greater than a relative dielectric constant of silicon oxide, and the high k gate dielectric material may be $HfO_2$, HfSiO, HfSiON, HfTaO, HfTiO, HfZrO, $ZrO_2$ or $Al_2O_3$. In some implementations, the material of the high k gate dielectric layer 124 is $HfO_2$.

A material of the gate electrode layer 125 is Al, Cu, Ag, Au, Pt, Ni, Ti or W. In some implementations, the material of the gate electrode layer 125 is W correspondingly.

In some implementations, the gate structure 126 is further located in the isolation layer 111, and the bottom of the gate structure 126 is lower than the top of the isolation layer 111, thus enforcing the controlling capability of the gate structure 126 over the fin 110, and reducing the probability that source-drain punching through and OFF current leakage occur in the fin 110.

It should be noted that the distance between the bottom of the gate structure 126 to the top of the isolation layer 111 should not be too small or too large. If the distance is too small, the effect of improving the controlling capability of the gate structure 126 over the fin 110 is not obvious, thus resulting in reduction in the effect of ameliorating the problems of source-drain punching through and OFF current leakage. If the distance is too large, the remaining thickness of the isolation layer 111 at the bottom of the groove 126 may be too small correspondingly, the difficulty in forming the gate structure 126 may be increased easily, the probability of generating defects such as empty holes in the gate structure 126 may be relatively high, and the distance between the gate structure 126 and the substrate 100 may be too short easily, so that parasitic capacitance formed by the gate electrode 126 and the substrate 100 may be too large. To this end, in some implementations, the distance between the bottom of the gate structure 126 to the top of the isolation layer 111 is 5 nm to 10 nm.

In some implementations, the bottom of the gate structure 126 is lower than the bottom of the source-drain doping layer 120. With the bottom of the groove 300 being lower than the bottom of the source-drain doping layer 120, the controlling capability of the gate structure 126 over the fin 110 is further increased, thereby facilitating the further improvement on the effect of ameliorating the problems of source-drain punching through and OFF current leakage.

It should be further noted that in some implementations, along the extending direction of the fin 110, a cross section of the gate structure 126 located in the isolation layer 111 is of an inverted trapezoid. Therefore, the closer to the bottom of the gate structure 126, the larger the distance between the gate structure 126 and the source-drain doping layer 120, which is advantageous for further reducing the probability that a short circuit occurs to the gate structure 126 and the source-drain doping layer 120. In other implementations, according to an actual process for forming a semiconductor structure, along the extending direction of the fin, the cross section of the gate structure located in the isolation layer may also be of a rectangle or other shapes.

Furthermore, in some implementations, along the extending direction of the fin 110, the width of the gate structure 126 located in the isolation layer 111 is a first width, and the width of the gate structure 126 exposed by the isolation layer 111 is a second width, where the first width is less than the second width, thereby facilitating preventing the distance between the gate structure 126 located in the isolation layer 111 and the source-drain doping layer 120 from being too short, and reducing the probability that a short circuit occurs to the gate structure 126 and the source-drain doping layer 120. In other implementations, according to actual process requirements, the first width may also be equal to the second width.

In some implementations, the semiconductor structure further includes: spacers 118 located on side walls of the gate structure 126.

The spacers 118 are used for protecting the side walls of the gate structure 126, and the spacers 118 are further used for defining regions for forming the source-drain doping layer 120.

In some implementations, the spacer 118 is of a laminate structure, and the spacer 118 correspondingly includes first spacers 115 located on the side walls of the gate structure 126, second spacers 116 located on side walls of the first spacers 115 and third spacers 117 located on side walls of the second spacers 116. In other implementations, the spacer may also be of a single structure.

In some implementations, materials of the first spacer 115 and the third spacer 117 are silicon oxide, and a material of the second spacer 116 is silicon nitride.

It should be noted that the gate structure 126 is formed by using a high k last metal gate last process, and before the gate structure 126 is formed, a dummy gate structure used is of a laminate structure. Therefore, the semiconductor structure further includes: a dummy gate oxide layer 112 (as shown in FIG. 18) located between the spacer 118 and the fin 110. During removing the dummy gate structure to form the gate structure 126, the dummy gate oxide layer 112 between the spacer 118 and the fin 110 is retained under the protection of the spacer 118.

In some implementations, a material of the dummy gate oxide layer 112 is silicon oxide. In other implementations, the material of the dummy gate oxide layer may also be silicon oxynitride.

In some implementations, the dummy gate oxide layer 112 is further located on the surface of the fin 110 exposed by the gate structure 126 and the source-drain doping region 120. In other implementations, the dummy gate oxide layer may also be located between the spacer and the fin merely.

In some other implementations, when the gate structure used is of a single structure, the semiconductor structure may also not include the gate oxide layer correspondingly.

It should be further noted that the semiconductor structure further includes: an interlayer dielectric layer 122 located on the substrate 100 exposed by the gate structure 126, where the interlayer dielectric layer 122 exposes the top of the gate structure 126.

The interlayer dielectric layer 122 is used for performing isolation between adjacent devices, and the interlayer dielectric layer 122 is further used for providing a process platform for forming a gate structure 126.

Therefore, a material of the interlayer dielectric layer 122 is an insulating material, for example, one or more of silicon oxide, silicon nitride, silicon oxynitride, silicon oxycarbide, silicon carbonitride, and silicon oxy-carbonitride.

In some implementations, the interlayer dielectric layer 122 is of a single structure, and the material of the interlayer dielectric layer 122 is silicon oxide.

Furthermore, in some implementations, the semiconductor structure further includes: an etch stop layer 121 covering the surface of the source-drain doping layer 120 in a conformal manner, where the etch stop layer 121 further covers the surface of the isolation layer 111 and the dummy gate oxide layer 112 and the side walls of the third spacer 117 in a conformal manner.

In some implementations, the etch stop layer 121 is a contact etch stop layer and used for defining an etch stop position of a subsequent contact etch process, thereby facilitating the reduction in damage to the source-drain doping layer 120 caused by the contact etch process.

In some implementations, a material of the etch stop layer 121 is silicon nitride. The silicon nitride material has a relatively large density and relatively high hardness, thereby ensuring that the etch stop layer 121 may function in defining the etch stop position of the subsequent contact etch process.

Therefore, in some implementations, the interlayer dielectric layer 122 further covers the etch stop layer 121.

The semiconductor structure may be formed by using the forming method according to the foregoing embodiments, and may also be formed by using other forming methods. For the specific description about the semiconductor structure in some implementations, reference can be made to the corresponding description in the foregoing embodiment, and details are not described again in some implementations.

Although the present disclosure is disclosed as above, it is not limited thereto. Various alterations and modifications may be made by a person skilled in the art without departing from the spirit and scope of the present disclosure, and therefore, with regard to the scope of protection of the present disclosure, the scope defined in the claims shall prevail.

What is claimed is:

1. A method for forming a semiconductor structure, comprising:
providing a base, wherein the base comprises a substrate and a fin protruding from the substrate, an isolation layer is formed on the substrate exposed by the fin, and the isolation layer covers a part of side walls of the fin;
forming a dummy gate structure across the fin, comprising a dummy gate layer, wherein the dummy gate structure covers a part of a top and a part of the side walls of the fin;
forming an interlayer dielectric layer on the substrate exposed by the dummy gate structure, wherein the interlayer dielectric layer exposes the top of the dummy gate structure;
removing the dummy gate layer and forming an opening in the interlayer dielectric layer;
forming an inner wall layer on side walls of the opening;
removing partial thickness of the isolation layer exposed by the opening and forming a groove in the isolation layer, wherein forming the groove in the isolation layer comprises: removing partial thickness of the isolation layer exposed by the inner wall layer using the inner wall layer as a mask film;
after forming the groove in the isolation layer, removing the inner wall layer; and
forming a gate structure in the groove and the opening, wherein the gate structure crosses the fin and covers a part of the top and a part of the side walls of the fin.

2. The method for forming a semiconductor structure according to claim 1, wherein after removing partial thickness of the isolation layer exposed by the opening, the depth of the groove is 5 nm to 20 nm.

3. The method for forming a semiconductor structure according to claim 1, wherein:
in the step of forming the dummy gate structure, the dummy gate structure further comprises a dummy gate oxide layer located at the bottom of the dummy gate layer;
the step of forming the groove in the isolation layer comprises: removing the dummy gate oxide layer and the partial thickness of the isolation layer exposed by the inner wall layer using the inner wall layer as a mask film; and
the method further comprises: after removing the inner wall layer, removing the remaining dummy gate oxide layer exposed by the opening.

4. The method for forming a semiconductor structure according to claim 3, wherein after the inner wall layer is removed, the remaining dummy gate oxide layer exposed by the opening is removed using a wet etch process.

5. The method for forming a semiconductor structure according to claim 4, wherein parameters of the wet etch process comprise:
an etching solution that is a diluted hydrofluoric acid solution, where a volume percent of hydrofluoric acid in the diluted hydrofluoric acid solution is 0.5% to 5%.

6. The method for forming a semiconductor structure according to claim 1, wherein in the step of forming an inner wall layer on side walls of the opening, along a direction perpendicular to the side walls of the opening, the width of the inner wall layer is 3 nm to 10 nm.

7. The method for forming a semiconductor structure according to claim 1, wherein a material of the inner wall layer is amorphous carbon or amorphous germanium.

8. The method for forming a semiconductor structure according to claim 1, wherein the inner wall layer is removed using an oxidization process when the material of the inner wall layer is amorphous carbon; or
the inner wall layer is removed using the wet etch process when the material of the inner wall layer is amorphous germanium.

9. The method for forming a semiconductor structure according to claim 1, wherein the step of forming the inner wall layer comprises:
forming an inner wall material layer covering the bottom and the side walls of the opening in a conformal manner; and
removing the inner wall material layer located at the bottom of the opening and retaining the remaining inner wall material layer located on the side walls of the opening as the inner wall layer.

10. The method for forming a semiconductor structure according to claim 9, wherein the inner wall material layer is formed using an atom layer deposition process.

11. The method for forming a semiconductor structure according to claim 9, wherein the inner wall material layer located at the bottom of the opening is removed using a mask film-free dry etch process.

12. The method for forming a semiconductor structure according to claim 1, wherein the partial thickness of the isolation layer exposed by the opening is removed using a dry etch process.

13. The method for forming a semiconductor structure according to claim 1, wherein the method further comprises:
after forming the dummy gate structure and before forming an interlayer dielectric layer on the substrate exposed by the dummy gate structure,
forming a source-drain doping layer in fins on two sides of the dummy gate structure; and
in the step of forming the groove, the bottom of the groove is lower than the bottom of the source-drain doping layer.

* * * * *